United States Patent [19]

Liang

[11] Patent Number: 5,699,916
[45] Date of Patent: Dec. 23, 1997

[54] INTEGRATED CIRCUIT WAFER CONTAINER

[75] Inventor: Wen-Sheng Liang, Hsin-Chu, Taiwan

[73] Assignee: Taiwan Semiconductor Manufacturing Company Ltd., Hsin-Chu, Taiwan

[21] Appl. No.: 794,600

[22] Filed: Feb. 3, 1997

[51] Int. Cl.$^6$ .................................................. B65D 85/30
[52] U.S. Cl. ........................... 206/710; 206/445; 206/499
[58] Field of Search ...................................... 206/701, 710, 206/711, 712, 445, 303, 718, 722, 723, 499

[56] References Cited

U.S. PATENT DOCUMENTS

| | | |
|---|---|---|
| 3,552,548 | 1/1971 | Wallestad et al. ................ 206/445 |
| 4,787,508 | 11/1988 | Wu et al. ........................... 206/445 |
| 5,273,159 | 12/1993 | Gregerson . |
| 5,366,079 | 11/1994 | Lin et al. . |
| 5,454,468 | 10/1995 | Chou et al. .................... 206/710 X |
| 5,551,571 | 9/1996 | Lin et al. ........................ 206/710 |
| 5,553,711 | 9/1996 | Lin et al. ........................ 206/710 |

*Primary Examiner*—Jacob K. Ackun
*Attorney, Agent, or Firm*—George O. Saile; Stephen B. Ackerman; Wolmar J. Stoffel

[57] ABSTRACT

An improved container for storing large diameter semiconductor wafers. The container has a body member and an enclosure member that are secured together with complimentary threaded portions. The top of the enclosure member has a circular upstanding flange spaced from a circular upstanding protrusion. Upstanding radially ribs are provided between the flange and protrusion to strengthen the enclosure member and provide a means for engagement with a wrench that will apply a torque force.

9 Claims, 2 Drawing Sheets

INTEGRATED CIRCUIT WAFER CONTAINER

BACKGROUND OF THE INVENTION

1. Field of the Invention

The present invention relates generally to integrated circuit (IC) wafer handling, and more particularly to an improved IC wafer container for use with large diameter wafers.

2. Description of the Invention

The transport and storage of semiconductor wafers has presented problems as the diameter of wafers has increased in size, and the circuitry has become more microminiturized. Containers for storing and transporting IC wafers are described in U.S. Pat. Nos. 4,787,508 and 5,366,079. While the disclosed containers are major improvements over other known containers, in certain situations, damage can still occur. The most vulnerable wafers are those that have a large diameter, typically 8 inches or more. Any movement or stress on the wafers within the container could potentially damage the very fragile metallurgy pattern on the surface of the wafer and/or break or crack the wafers.

U.S. Pat. No. 5,366,079 discloses a container and retainer combination that effectively reduces damage due to shifting of the wafers in the container. However, the storage and handling of very large diameter wafers still presents problems due to the flexing of the large diameter containers when they are opened and .otherwise manipulated resulting in fractured and broken wafers.

SUMMARY OF THE INVENTION

It is an object of the invention to provide an improvement in the handling and storage of IC wafers.

A further object of the invention is to provide a novel cover structure of a wafer container for stabilizing wafers in the container by reducing or eliminating flexure of the container.

In accordance with the afore-mentioned objectives, there is presented an integrated circuit wafer container for stabilizing wafers within the container. The container has an enclosure member and a body member which together enclose a volume to accept wafers for storage, for handling, or for transportation. The body member has a base, and a plurality of spaced upright arcuate members supported on the base that are adapted to encircle wafers stacked on the base. The enclosure member has a circular top wall and a cylindrically shaped wall that is adapted to encompass and enclose the arcuate members. A means is provided to secure the body member and the enclosure member together in sealed relation. The retainer element can be provided that has a flat central portion, and a plurality of flexible outwardly extending flaps depending from the central portion, with the flaps inclined downwards from the plane of the central portion. The retainer element fits within the arcuate members of the body member with the end portions of the flaps positioned in the slots between the arcuate members. The improvement is an enclosure member provided with an upwardly extending concentric circular flange on the top wall, a central upwardly extending protrusion on the top wall, and a plurality of radially extending ribs between the circular flange and the central protrusion.

DETAILED DESCRIPTION OF THE PREFERRED EMBODIMENT

Figure 1:
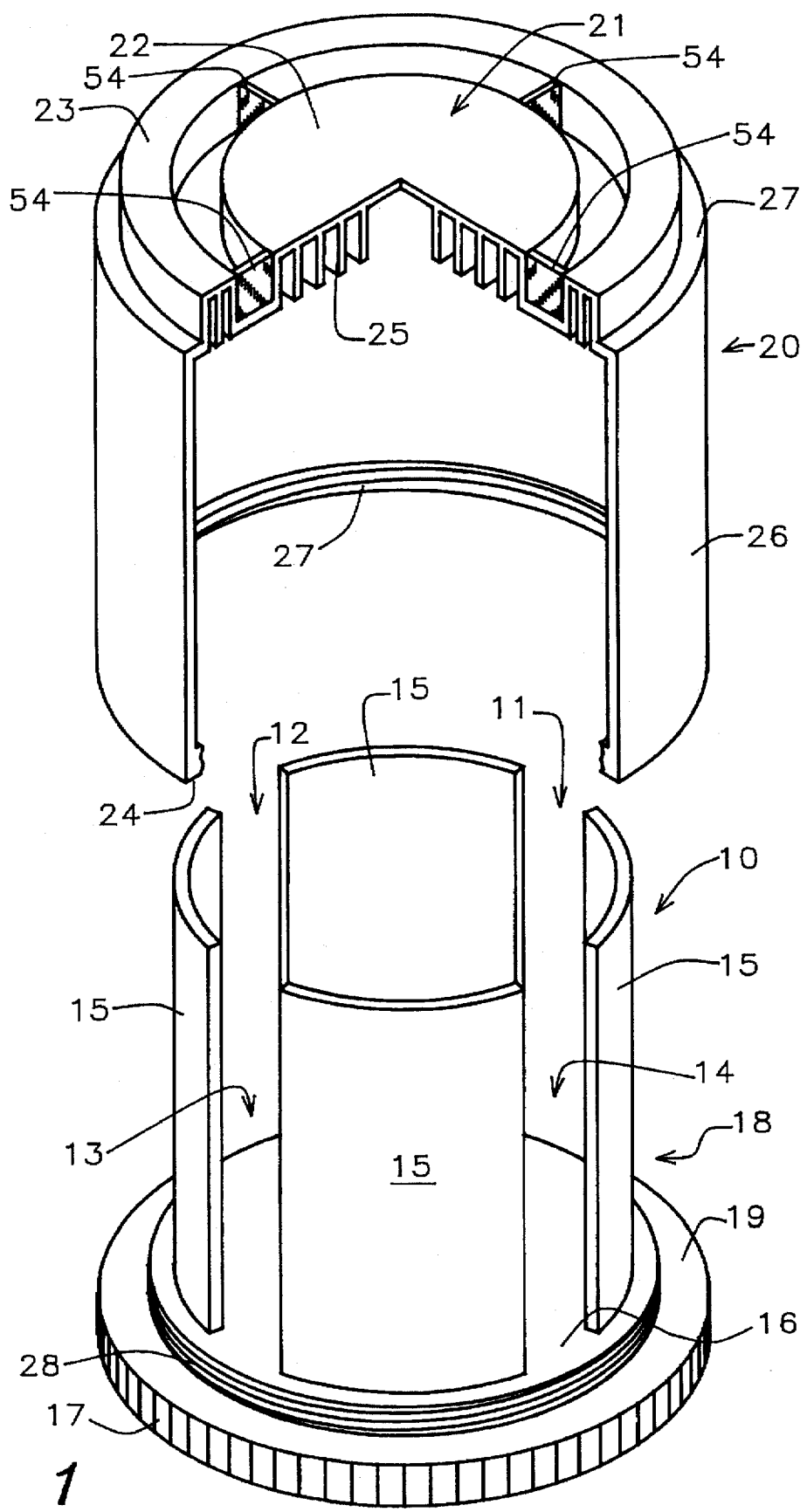
FIG. 1 is a perspective view of the wafer container of the invention in exploded relation.
Figure 2:
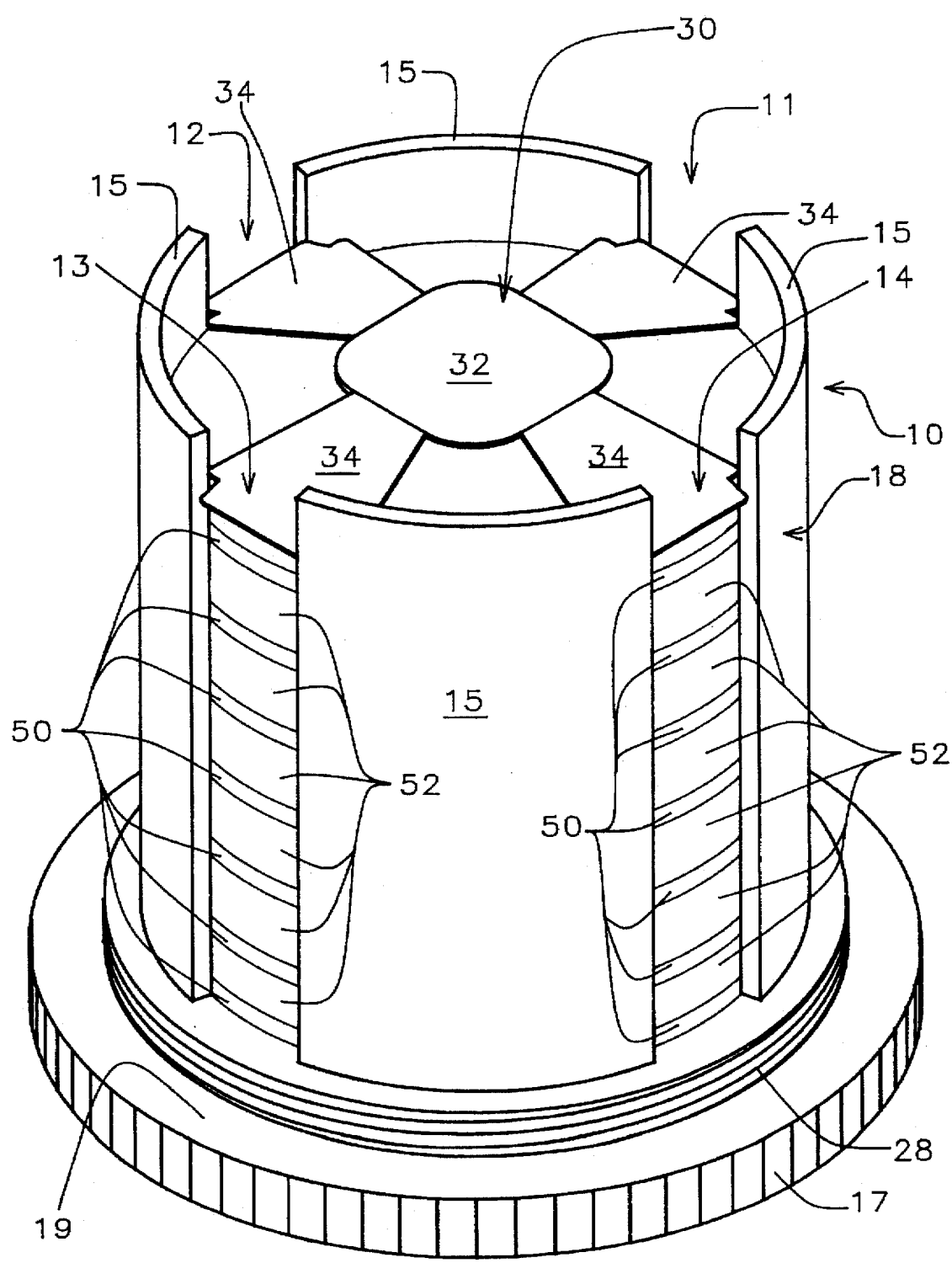
FIG. 2 is a perspective view of the body member of the wafer container, shown with a plurality of semiconductor wafers stored within, and with the retainer element mounted in position over the wafers.

Referring now to the drawings, FIG. 1, shows a preferred embodiment of the wafer container element of the invention. The container is comprised of two parts, i. e. an enclosure member 20 and a body member 10. The body member 10 is formed of a hollow cylindrical body 18, a circular base 16, and a circular flange 17 having a larger diameter than that of base 16. The base 16 has a plurality of screw threads 28 around the circumference thereof. Cylindrical body 18 is made up of a plurality of arcuate longitudinally directed members 15 supported on base 16, which are adapted to encircle semiconductor wafers stacked on the base, as more clearly shown in FIG. 2. Arcuate members 15 are spaced from each other to form slots 11, 12, 13, and 14. The enclosure member 20 has a top circular wall 21 joined to a cylindrically shaped wall 26, that is adapted to encompass and enclose the cylindrical body 18, i. e. arcuate members of body member 10. Threadeortion 27 interfits with threaded portion 28 on base 16 to secure the body member 10 and enclosure member 20 in sealed relationship. The lower annular end surface 24 of enclosure member abuts surface 19 on body member 10. An annular flange 17, on the bottom of body member 20 is adapted to inter fit with a circular upright flange 23 on enclosure member 20, to permit vertical stacking of the containers. Protuberances 25 strengthen the top wall of central upwardly extending protuberance 22, and are used to press the retainer element 30 against wafers stacked in body member 10.

The subject improvement is a novel structural feature incorporated in enclosure member 20, and used in combination with the aforedescribed body member 10. As shown in FIG. 1, a plurality of radially extending ribs 54 are provided on enclosure member 20, located between the upwardly extending thick concentric circular flange 23 on top wall 21, and the upwardly extending protrusion 22. Ribs 54 serve to reinforce the top wall 21 of enclosure member 20, preventing flexure of the top wall 21 and also cylindrical wall 26. Flexure of the enclosure member 20 is very likely to occur when the container is opened or closed. The large diameter of the wafers now in use, and projected for use in the future, require containers of increased diameter. As the diameter of the containers increases, the diameters of the threaded portions, 27 and 28, must also increase. Consequently more friction occurs between the threaded portions which must be overcome in opening and closing the container. In applying a torque force to open or close the container, a greater lateral force must be applied to the enclosure member in order to properly grip the member. This lateral force can bend the walls of the enclosure members of containers of the prior art, thereby applying stresses on the wafers within the container. This stress can cause cracking, and breakage of the wafers which is very serious because of the great value of the wafers. The problem is particularly troublesome with wafers having a diameter of 8 inches of greater. The ribs 54 also strengthen the enclosure member and container to reduce stresses on the wafers during routine handling of the containers. The ribs can also be used in combination with a suitable wrench that interacts with the ribs to apply a torque force to the enclosure member.

While the invention has been particularly shown and described with reference to the preferred embodiments thereof, it will be understood by those skilled in the art that various changes in form and detail may be made therein without departing from the spirit and scope of the invention.

I claim:

1. An improved integrated circuit wafer container for storing large diameter integrated circuit wafers therein, having an enclosure member and a body member, the body member having a base with spaced longitudinally directed portions adapted to encircle and hold wafers stacked on the base, the enclosure member having a circular shaped top wall and a cylindrical shaped side wall that encompasses and encircles the longitudinally directed portions of the body members, a threaded portion on the lower end of the cylindrical wall that engages with a complimentary threaded portion on the base that selectively secures the enclosure member to the body member, the improvement comprising, an upwardly extending thick concentric circular flange on said circular shaped top wall adjacent the periphery of said top wall, a central upwardly extending protrusion on the top wall, and a plurality of radially extending ribs between said circular flange and said central protrusion.

2. The container of claim 1 wherein said central protrusion is circular in shape.

3. The wafer container of claim 2 wherein the heights of said circular flange, said central protrusion, and said ribs are the same.

4. The wafer container of claim 2 wherein a plurality of downwardly extending fins are provided on the bottom surface of said protrusion.

5. The wafer container of claim 4 wherein at least one downwardly extending fin is provided on the bottom surface of said circular flange.

6. The wafer container of claim 4 wherein said fins on the bottom surface of said protrusion are circular in shape.

7. The wafer container of claim 1 wherein said circular flange is spaced inwardly from the periphery of said top wall.

8. The wafer container of claim 2 wherein said protrusion and said flange are hollow.

9. The wafer container of claim 2 wherein the inside diameter of said base member is 8 inches or greater.

* * * * *